United States Patent
Baris et al.

(10) Patent No.: US 10,712,289 B2
(45) Date of Patent: Jul. 14, 2020

(54) INSPECTION FOR MULTIPLE PROCESS STEPS IN A SINGLE INSPECTION PROCESS

(71) Applicant: KLA-Tencor Corporation, Milpitas, CA (US)

(72) Inventors: Oksen Toros Baris, San Francisco, CA (US); Raghav Babulnath, San Jose, CA (US)

(73) Assignee: KLA-Tencor Corp., Milpitas, CA (US)

( * ) Notice: Subject to any disclaimer, the term of this patent is extended or adjusted under 35 U.S.C. 154(b) by 421 days.

(21) Appl. No.: 14/809,774

(22) Filed: Jul. 27, 2015

(65) Prior Publication Data

US 2016/0033420 A1 Feb. 4, 2016

Related U.S. Application Data (60) Provisional application No. 62/030,074, filed on Jul. 29, 2014.

(51) Int. Cl.
*G01N 21/95* (2006.01)
*G01B 11/14* (2006.01)
(Continued)

(52) U.S. Cl.
CPC ......... *G01N 21/9501* (2013.01); *G01B 11/14* (2013.01); *G01N 21/956* (2013.01); *G03F 7/7065* (2013.01); *G03F 7/70466* (2013.01)

(58) Field of Classification Search
CPC ... G01N 21/9501; G01N 21/956; H01L 22/12
See application file for complete search history.

(56) References Cited

U.S. PATENT DOCUMENTS 5,761,064 A  6/1998 La et al.
5,828,778 A  10/1998 Hagi et al.
(Continued)

FOREIGN PATENT DOCUMENTS

CN  101719477  6/2010
JP  2012-251935  12/2012
(Continued)

OTHER PUBLICATIONS

International Search Report for PCT/US2015/042475 dated Nov. 30, 2015.
(Continued)

*Primary Examiner* — Rebecca C Bryant
(74) *Attorney, Agent, or Firm* — Ann Marie Mewherter (57) ABSTRACT

Various embodiments for detecting defects on a wafer are provided. One method includes acquiring output generated by an inspection system for a wafer during an inspection process that is performed after at least first and second process steps have been performed on the wafer. The first and second process steps include forming first and second portions, respectively, of a design on the wafer. The first and second portions of the design are mutually exclusive in space on the wafer. The method also includes detecting defects on the wafer based on the output and determining positions of the defects with respect to the first and second portions of the design. In addition, the method includes associating different portions of the defects with the first or second process step based on the positions of the defects with respect to the first and second portions of the design.

20 Claims, 6 Drawing Sheets

(51) Int. Cl.
    *G03F 7/20*      (2006.01)
    *G01N 21/956*    (2006.01)

(56) References Cited

U.S. PATENT DOCUMENTS

| | | | |
|---|---|---|---|
| 6,610,550 B1 | 8/2003 | Pasadyn et al. | |
| 6,886,153 B1 | 4/2005 | Bevis | |
| 7,105,815 B2 | 9/2006 | Obara et al. | |
| 7,570,796 B2 | 8/2009 | Zafar et al. | |
| 8,081,814 B2 * | 12/2011 | Matsushita | G06K 9/4604 356/237.4 |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 2003/0054573 A1 * | 3/2003 | Tanaka | H01L 21/67276 438/4 |
| 2003/0182252 A1 | 9/2003 | Beinglass et al. | |
| 2008/0067371 A1 * | 3/2008 | Kurihara | G01N 21/9501 250/307 |
| 2012/0308112 A1 | 12/2012 | Hu et al. | |
| 2014/0037187 A1 | 2/2014 | Marcucilli et al. | |
| 2015/0060667 A1 | 3/2015 | Yamaguchi et al. | |

FOREIGN PATENT DOCUMENTS

| | | |
|---|---|---|
| JP | 2013-222734 | 10/2013 |
| TW | 535207 | 6/2003 |

OTHER PUBLICATIONS

Written Opinion of the International Searching Authority for PCT/US2015/042475 dated Nov. 30, 2015.

* cited by examiner

INSPECTION FOR MULTIPLE PROCESS STEPS IN A SINGLE INSPECTION PROCESS

BACKGROUND OF THE INVENTION

1. Field of the Invention

The present invention generally relates to systems and methods for inspecting a wafer after multiple process steps are performed on the wafer and determining which of the process steps corresponds to the defects detected by the inspection.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Currently, each process step is monitored for excursions and performance using a single inspection step. For example, the wafer may go through a specific process step (e.g., chemical vapor deposition (CVD), deposition, etching, or a similar semiconductor manufacturing step). The wafer is then transferred to an inspection tool to inspect for defectivity and other process-related issues.

Figure 7:
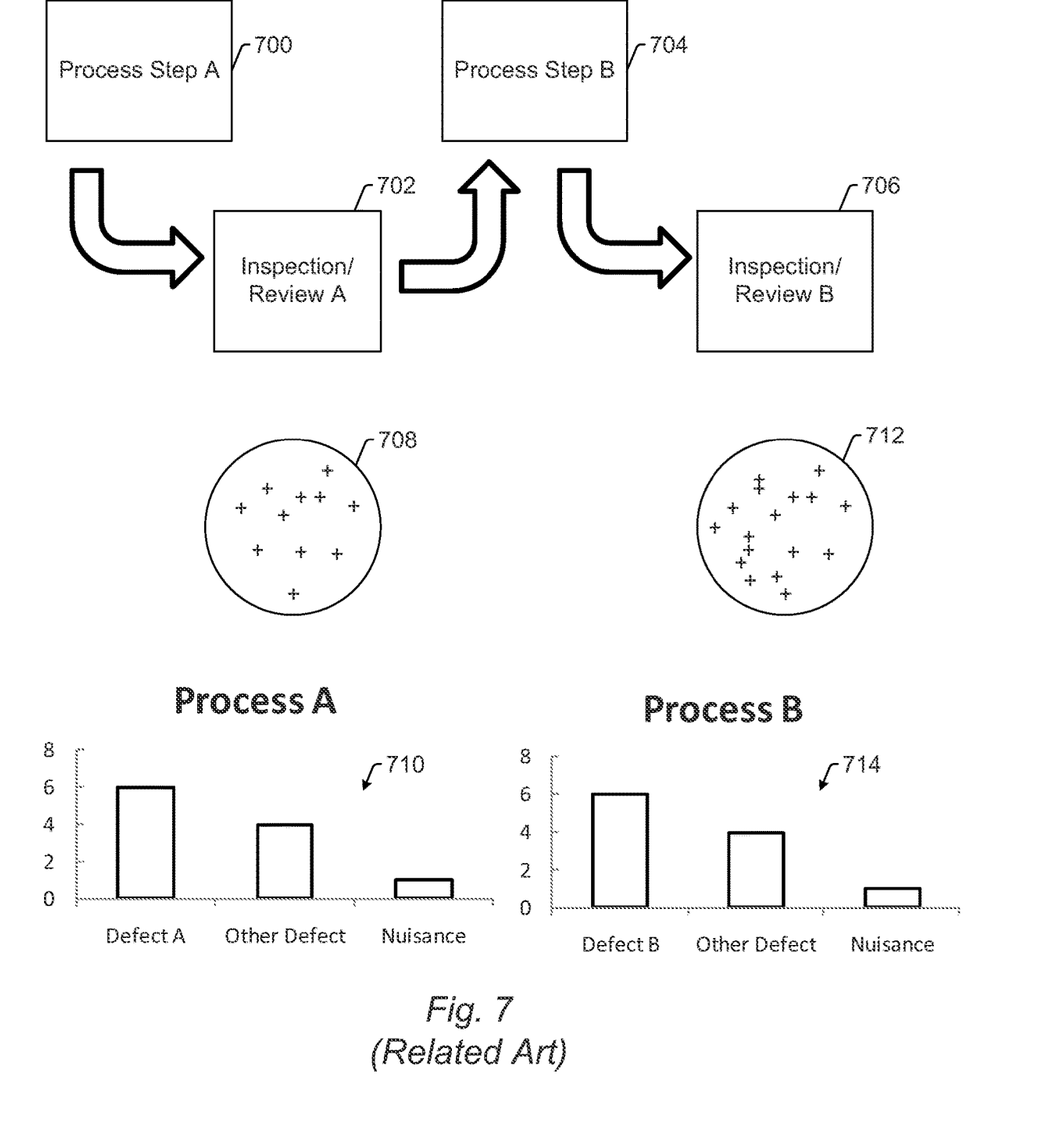
FIG. 7 is a flow chart illustrating one example of a currently used method for detecting defects on a wafer.

In one such example, a wafer may be processed in process step A, as shown in step 700 in FIG. 7. The wafer may then be transferred from the process tool that performs process step A to one or more other tools (inspection and/or review tools) for inspection/review A, as shown in step 702. The wafer may then be transferred from the inspection and/or review tools to another process tool for process step B, as shown in step 704. The wafer may then be transferred again from the process tool that performs process step B to one or more other tools (inspection and/or review tools) for inspection/review B, as shown in step 706.

Different results may, therefore, be generated in the different inspection/review processes shown in FIG. 7. For example, inspection results generated by inspection/review A may include wafer map 708 and pareto chart 710 shown in FIG. 7. Wafer map 708 may show the locations of defects detected on the wafer after process A while pareto chart 710 may show the number of different types of defects or events detected on the wafer after process A. In addition, inspection results generated by inspection/review B may include wafer map 712 and pareto chart 714 shown in FIG. 7. Wafer map 712 may show the locations of defects detected on the wafer after process B while pareto chart 714 may show the number of different types of defects or events detected on the wafer after process B.

Current methodologies, therefore, only cover one-to-one correlations between process and inspection. In other words, each inspection step is correlated to its one respective process step. In this manner, current methodologies rely on simple correlations in which any result from an inspection tool can be directly used for understanding the process issues from a process tool.

There are, however, a number of disadvantages to such current methodologies. For example, for multiple process steps that are to be monitored, the current methods require additional time and effort on the inspection tool (e.g., 2× time and effort for 2 process steps, 3× time and effort for 3 process steps, and so on). In addition, the current methodology requires additional steps of transferring a wafer from a first process tool to the inspection tool back to the second process tool (and repeating the transfer back to the inspection tool if the second process tool is also to be monitored). This additional wafer transferring increases the queue time in the fab. All wafer transfers also introduce the possibility of particle contamination of the wafer during transfer between tools.

Accordingly, it would be advantageous to develop methods and systems for detecting defects on a wafer that do not have one or more of the disadvantages described above.

SUMMARY OF THE INVENTION

The following description of various embodiments is not to be construed in any way as limiting the subject matter of the appended claims.

One embodiment relates to a system configured to detect defects on a wafer. The system includes an optical subsystem that includes at least a light source and a detector. The optical subsystem is configured to direct light generated by the light source to the wafer and to detect light from the wafer with the detector during an inspection process performed on the wafer. The inspection process is performed after at least first and second process steps have been performed on the wafer. Inspection of the wafer is not performed between the first and second process steps. The first process step includes forming a first portion of a design for the wafer on the wafer, and the second process step includes forming a second portion of the design for the wafer on the wafer. The first and second portions of the design are mutually exclusive in space on the wafer.

The system also includes one or more computer subsystems configured for receiving output generated by the detector responsive to the tight detected by the detector. The computer subsystem(s) are also configured for detecting defects on the wafer based on the output. In addition, the computer subsystem(s) are configured for determining positions of the defects with respect to the first and second portions of the design and associating different portions of the defects with the first or second process step based on the positions of the defects with respect to the first and second portions of the design. The system may be further configured according to any embodiment(s) described herein.

Another embodiment relates to a computer-implemented method for detecting defects on a wafer. The method includes acquiring output generated by an inspection system for a wafer during an inspection process performed on the wafer. The inspection process is performed after at least first and second process steps have been performed on the wafer, inspection of the wafer is not performed between the first and second process steps. The first process step includes forming a first portion of a design for the wafer on the wafer, and the second process step includes forming a second portion of the design for the wafer on the wafer. The first and second portions of the design are mutually exclusive in space on the wafer. The method also includes detecting defects on the wafer based on the output. In addition, the method includes determining positions of the defects with respect to the first and second portions of the design. The method further includes associating different portions of the defects with the first or second process step based on the positions of the defects with respect to the first and second portions of the design.

Each of the steps of the method described above may be further performed as described herein. In addition, the method described above may include any other step(s) of any other method(s) described herein. Furthermore, the method described above may be performed by any of the systems described herein.

Another embodiment relates to a non-transitory computer-readable medium containing program instructions stored therein for causing a computer system to perform a computer-implemented method for detecting defects on a wafer. The computer implemented method includes the steps of the method described above. The computer-readable medium may be further configured as described herein. The steps of the method may be performed as described further herein. In addition, the method may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

Figure 1:
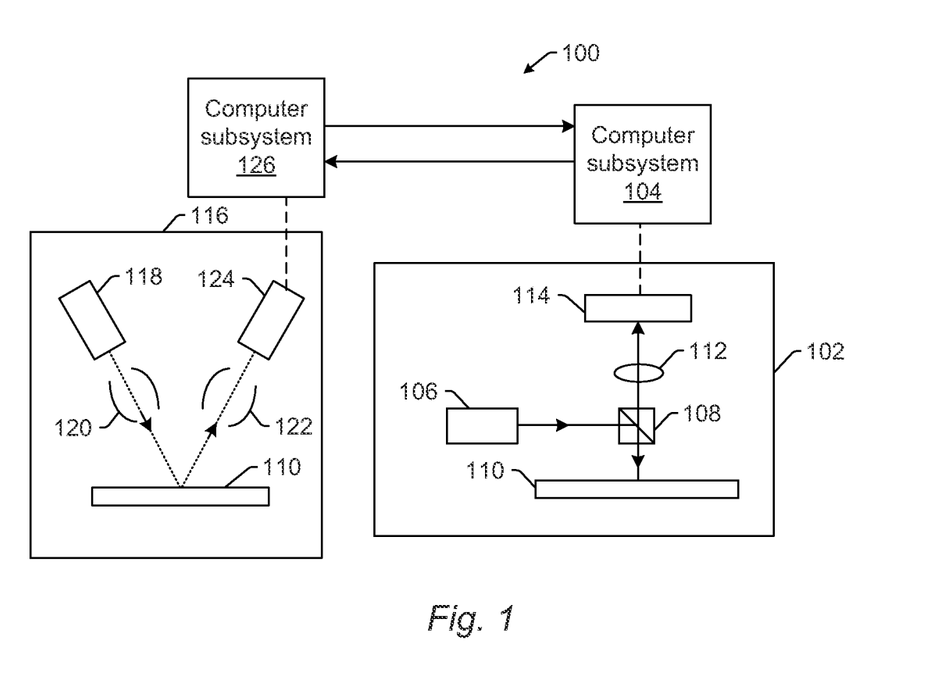
FIG. 1 is a schematic diagram illustrating a side view of one embodiment of a system configured according to embodiments described herein.

One embodiment relates to a system configured to detect defects on a wafer. One embodiment of such a system is shown in FIG. 1. System 100 includes optical subsystem 102, which is configured as described further herein. The system may also include computer subsystem 104 configured for performing one or more steps using output generated by the optical subsystem as described further herein. The optical subsystem and computer subsystem 104 in combination may form at least part of a wafer inspection system, which may be configured and used as described further herein.

The optical subsystem includes at least a light source and a detector. The optical subsystem is configured to direct light generated by the light source to the wafer and to detect light from the wafer with the detector during an inspection process performed for the wafer. For example, as shown in FIG. 1, the optical subsystem includes light source 106, which may include any suitable light source known in the art such as a broadband plasma (BBP) light source. Light from the light source may be directed to beam splitter 108, which may be configured to direct the light from the light source to wafer 110. The light source may be coupled to any other suitable elements (not shown) such as one or more condensing lenses, collimating lenses, relay lenses, objective lenses, apertures, spectral filters, polarizing components and the like. As shown in FIG. 1, the light may be directed to the wafer at a normal angle of incidence. However, the light may be directed to the wafer at any suitable angle of incidence including near normal and oblique incidence. In addition, the light or multiple light beams may be directed to the wafer at more than one angle of incidence sequentially or simultaneously. The optical subsystem may be configured to scan the light over the wafer in any suitable manner.

Light from wafer 110 may be collected and detected by one or more channels of the optical subsystem during scanning. For example, light reflected from wafer 110 at angles relatively close to normal (i.e., specularly reflected light when the incidence is normal) may pass through beam splitter 108 to lens 112. Lens 112 may include a refractive optical element as shown in FIG. 1. In addition, lens 112 may include one or more refractive optical elements and/or one or more reflective optical elements. Light collected by lens 112 may be focused to detector 114. Detector 114 may include any suitable detector known in the art such as a charge coupled device (CCD) or another type of imaging detector. Detector 114 is configured to generate Output that is responsive to the reflected light collected by lens 112. Therefore, lens 112 and detector 114 form one channel of the optical subsystem. This channel of the optical subsystem may include any other suitable optical components (not shown) known in the art.

Since the optical subsystem shown in FIG. 1 is configured to detect light specularly reflected from the wafer, the optical subsystem is configured as a bright field (BF) optical subsystem. Such an optical subsystem may, however, also be configured for other types of wafer inspection. For example, the optical subsystem shown in FIG. 3 may also include one or more other channels (not shown). The other channel(s) may include any of the optical components described herein such as a lens and a detector, configured as a scattered light channel. The lens and the detector may be further configured as described herein. In this manner, the optical subsystem may also be configured for dark field (DF) inspection.

Computer subsystem 104 is coupled to the optical subsystem such that output generated by the detector(s) during scanning may be provided to computer subsystem 104. In this manner, the computer subsystem is configured for receiving output generated by the detector that is responsive to the light detected by the detector. For example, the computer subsystem may be coupled to detector 114 (e.g., by one or more transmission media shown by the dashed line in FIG. 1, which may include any suitable transmission media known in the art) such that the computer subsystem may receive the output generated by the detector. The computer subsystem may be configured to perform any step(s) using the output generated by the detector including those described further herein.

As described above, the optical subsystem may be an optical subsystem of an inspection system. However, the optical subsystems described herein may be part of other types of inspection systems such as metrology systems. A metrology system in which an optical subsystem described herein is included may include any suitable metrology system known in the art.

The system shown in FIG. 1 may also include a defect review subsystem configured to generate images of a sampled portion of defects detected on the wafer. In one such embodiment, the defect review subsystem includes an electron beam-based defect review subsystem. However, the defect review subsystem may include any other suitable defect review subsystem known in the art. In this manner, the system may include a defect review subsystem configured to acquire an electron beam image for a location of a defect detected on a wafer by a wafer inspection system as described further herein. The electron beam defect review subsystem shown in FIG. 1 includes electron column 116 coupled to computer subsystem 126.

As also shown in FIG. 1, computer subsystem 104 coupled to the optical subsystem and computer subsystem 126 of the electron beam defect review subsystem may be coupled by a transmission medium (as shown by the solid lines between the computer subsystems). Therefore, the defect review subsystem may be coupled to the optical subsystem via their computer subsystems. The computer subsystems of the inspection and defect review systems may be coupled to send information between the two computer subsystems.

The electron column includes electron beam source 118 configured to generate electrons that are focused to wafer 110 by one or more elements 120. The electron beam source may include, for example, a cathode source or emitter tip, and one or more elements 120 may include, for example, a gun lens, an anode, a beam limiting aperture, a gate valve, a beam current selection aperture, an objective lens, and a scanning subsystem, all of which may include any such suitable elements known in the art. Electrons returned from the wafer (e.g., secondary electrons) may be focused by one or more elements 122 to detector 124. One or more elements 122 may include, for example, a scanning subsystem, which may be the same scanning subsystem included in element(s) 120. The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojinia et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein. Although the electron column is shown in FIG. 1 as being configured such that the electrons are directed to the wafer at an oblique angle of incidence and are scattered from the wafer at another oblique angle, it is to be understood that the electron beam may be directed to and scattered from the wafer at any suitable angles.

Computer subsystem 126 may be coupled to detector 124 as described above. The detector may detect electrons returned from the surface of the wafer thereby forming electron beam images of the wafer, which may include any suitable electron beam images known in the art. Computer subsystem 126 may be configured to perform one or more functions described herein based on electron beam images generated by the detector. Computer subsystem 126 may be configured to perform any additional step(s) described herein.

It is noted that FIG. 1 is provided herein to generally illustrate a configuration of an optical subsystem and defect review subsystem that may be included in the system embodiments described herein. Obviously, the optical and defect review subsystem configurations described herein may be altered to optimize the performance of the inspection system and defect review system as is normally performed when designing commercial inspection and defect review systems. In addition, the systems described herein may be implemented using an existing inspection system and/or existing defect review system (e.g., by adding functionality described herein to an existing inspection or defect review system) such as the 29xx, 9xxx, and eDR series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

As shown in FIG. 1, the system may include two computer subsystems 104 and 126. However, the system may alternatively include just one computer subsystem. Furthermore, the system may also include other computer subsystem(s) (not shown) such as a stand-alone computer subsystem that is not part of any inspection or defect review tool but is configured to perform one or more functions described herein. In this manner, the same, one computer subsystem may be configured to perform all of the functions described herein. Alternatively, some of the functions described herein may be performed by one computer subsystem white other functions described herein are performed by another computer subsystem.

In this manner, the computer subsystems shown in FIG. 1 and all other computer subsystems described herein are collectively referred to as one or more computer subsystems, and the terms "computer subsystem" and "computer system" are used interchangeably herein. A computer system may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system may also include any suitable processor known in the art such as a parallel processor. In addition, the computer system may include a computer platform with high speed processing and software, either as a standalone or a networked tool.

The inspection process is performed on the wafer after at least first and second process steps have been performed on the wafer. Inspection of the wafer is not performed between the first and second process steps. The first process step includes forming a first portion of a design for the wafer on the wafer, and the second process step includes forming a second portion of the design for the wafer on the wafer. The first and second portions of the design are mutually exclusive in space on the wafer.

Figure 4:
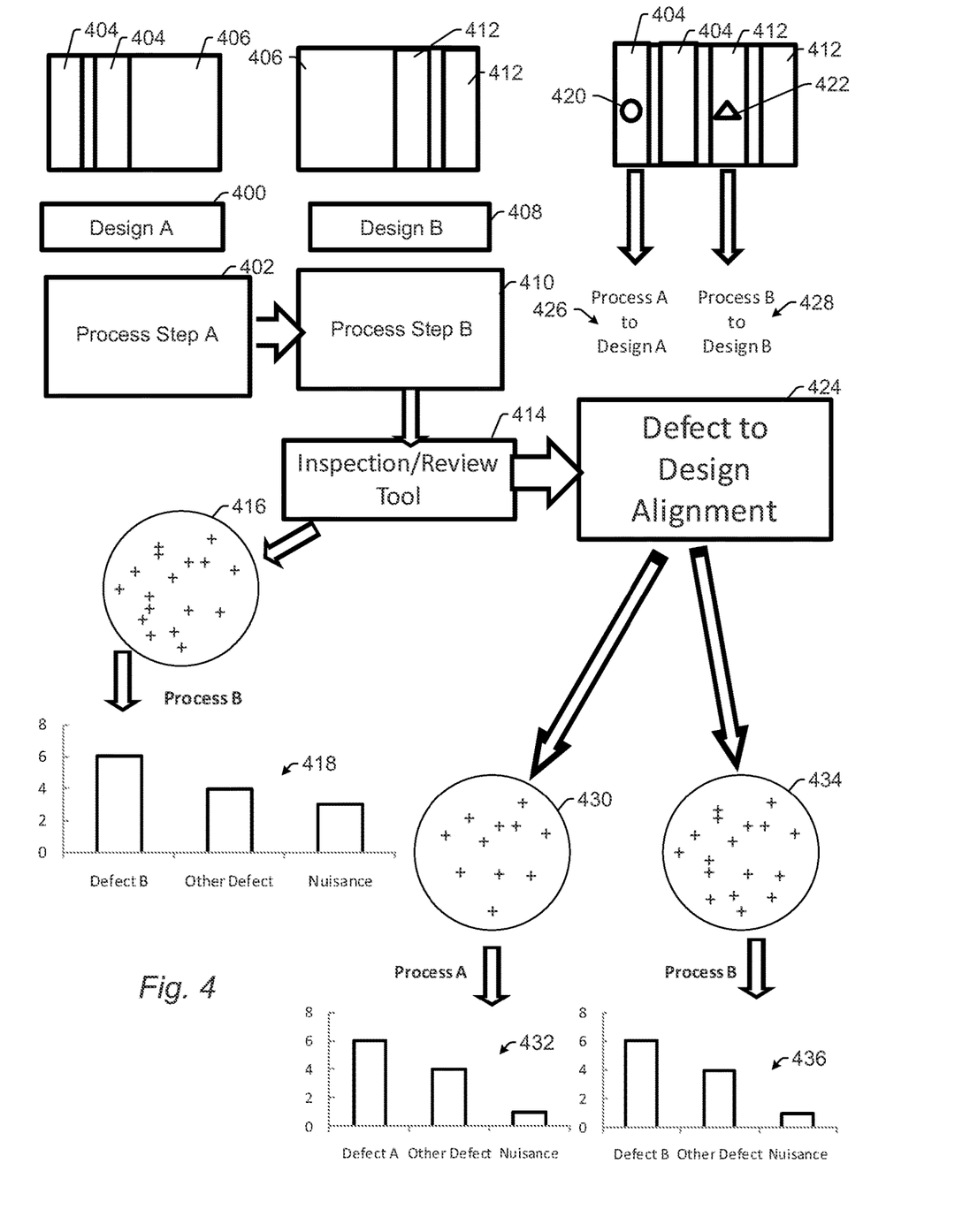
FIGS. 4-5 are flow charts illustrating embodiments of functions that may be performed by systems described herein.

As shown in FIG. 4, design A, 400, may be formed on a wafer in process step A, 402, Design A may include two patterned features 404 formed on wafer 406. After process step A, design B, 408, may be formed on the wafer in process step B, 410. Design B may include two patterned features 412 formed on wafer 406. As shown in FIG. 4, patterned features 404 and patterned features 412 are mutually exclusive in space on the wafer, and such spatial arrangements are described further herein.

After process step B has been performed on the wafer, the wafer may be transferred to inspection/review tool 414 that performs the inspection process on the wafer. In this manner, the wafer may be processed using process step A. Process step A may be any first step of a multi-step semiconductor process. For example, process step A may be a first etching step, a first deposition step, etc. The wafer may then be transferred to a second process tool for process step B, which may be the second step of the multi-step semiconductor process. For example, process step B may be a second etching step, a second deposition step, etc. The wafer may then be transferred to an inspection/review tool 414.

Figure 2:
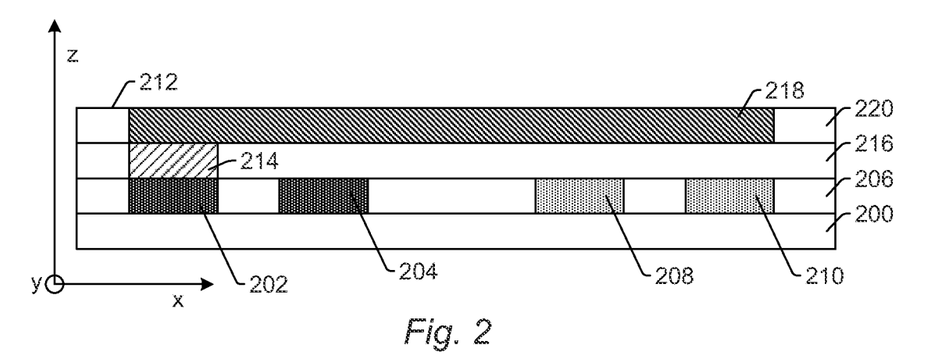
FIG. 2 is a schematic diagram illustrating a cross-sectional of one example of different portions of a design for a wafer formed on the wafer.

In one embodiment, the space in which the first and second portions of the design are mutually exclusive is in a plane substantially parallel to an upper surface of the wafer. For example, as shown in FIG. 2, wafer substrate 200 may have a number of different patterned features formed thereon. The patterned features shown in FIG. 2 and other figures described herein are not meant to represent any particular patterned features on any particular wafer. Instead, the patterned features shown in the figures described herein are merely intended to illustrate the various spatial relationships between the first and second portions of the design thereby furthering understanding of the embodiments described herein.

In the example of FIG. 2, patterned features 202 and 204 may be formed on wafer substrate 200 in layer 206. In addition, patterned features 208 and 210 may be formed on wafer substrate 200 in the same layer. However, patterned features 202 and 204 may be formed in a first process step performed on the wafer while patterned features 208 and 210 may be formed in a second process step performed on the wafer. Therefore, patterned features 202 and 204 may be considered to be part of a first portion of a design for the wafer while patterned features 208 and 210 may be considered to be part of a second portion of the design for the wafer.

As further shown in FIG. 2, patterned features 202 and 204 and patterned features 208 and 210 are mutually exclusive in space by being mutually exclusive in a plane substantially parallel to upper surface 212 of the wafer. In other words, since patterned features 202 and 204 and patterned features 208 and 210 have non-overlapping positions in the x and y directions shown in FIG. 2, the different portions of the design corresponding to the different patterned features are mutually exclusive in the x,y plane, which is substantially parallel to the upper surface of the wafer.

Inspection of the wafer may not, therefore, be performed between the process step that formed patterned features 202 and 204 on the wafer and the process step that formed patterned features 208 and 210 on the wafer. Instead, the inspection may be performed only after patterned features 202 and 204 and patterned features 208 and 210 have been formed on the wafer. In addition, the inspection may be performed before other patterned features shown in FIG. 2 and described further herein have been formed on the wafer.

Figure 3:
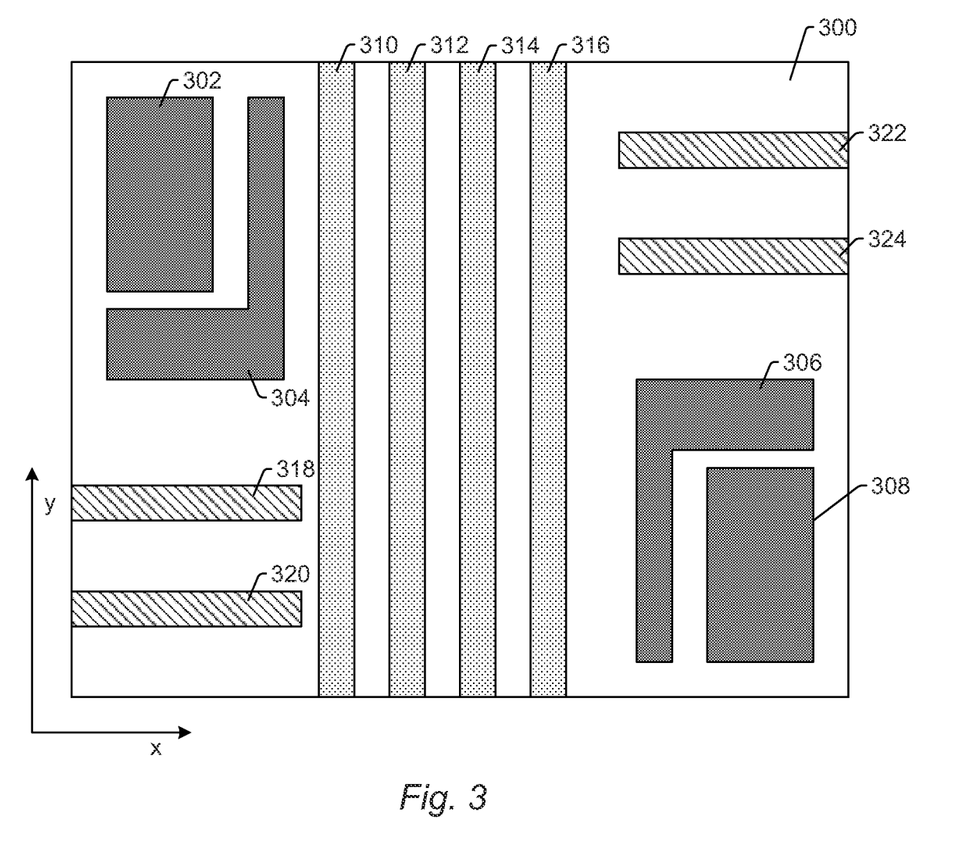
FIG. 3 is a schematic diagram illustrating a plan view of one example of different portions of a design for a wafer formed on the wafer.

FIG. 3 shows another example of different portions of a design for a wafer that are formed on the wafer in different process steps performed on the wafer and that are mutually exclusive in a plane substantially parallel to an upper surface of the wafer. For example, a first portion of a design for wafer 300 may include patterned features 302, 304, 306, and 308 that are formed on the wafer in a first process step performed on the wafer. A second portion of the design for wafer 300 may include patterned features 310, 312, 314, and 316 that are formed on the wafer in a second process step performed on the wafer. In addition, a third portion of the design for wafer 300 may include patterned features 318, 320, 322, and 324 formed on the wafer in a third process step performed on the wafer. Therefore, as shown in FIG. 3, the patterned features included in each portion of the design are mutually exclusive in the x,y plane defined by the x and y directions shown in FIG. 3. In other words, none of the patterned features shown in FIG. 3 have overlapping, positions in the x,y plane, which is parallel to the upper surface of the wafer. As such, each of the different portions of the design shown in FIG. 3 are mutually exclusive of each other in a plane substantially parallel to the upper surface of the wafer.

In another embodiment, the patterned features included in the first portion of the design are mutually exclusive of the patterned features included in the second portion of the design. In other words, none of the patterned features included in the first portion of the design are also included in the second portion of the design. As such, any one patterned feature may be included in only one portion of the design. In addition, different portions of one patterned feature may not be considered to be included in different portions of the design. For example, a liner layer of a contact and a different portion of the same contact may not be included in different portions of the design even though they may be formed in different process steps. In particular, as described further herein, the positions of defects with respect to different portions of a design as well as the correlation between the different portions of the design and different process steps performed on the wafer are used to associate different defects with different process steps. Therefore, if different portions of a single patterned feature on the wafer cannot be distinguished from each other in output of the inspection system (as when they appear to the inspection system as a single patterned feature), the positions of the defects with respect to the different portions of the design may not be determined with sufficient accuracy thereby preventing defects to be associated with the different process steps correlated to the different portions of the design with sufficient accuracy.

In some embodiments, the first portion of the design is not formed above or below the second portion of the design. For example, as shown in FIG. 2, some patterned features may be formed on a wafer above or below other patterned feature(s) on the wafer. In particular, as shown in FIG. 2, patterned feature 214 in layer 216 may be formed above patterned feature 202 on layer 206. In addition, patterned feature 218 in layer 220 may be formed above patterned features 202, 204, 208, and 210 in layer 206 and patterned feature 214 in layer 216. Therefore, patterned feature 214 may not be part of one portion of the design when patterned feature 202 is part of another portion of the design. In addition, patterned feature 218 may not be part of a portion of the design when patterned features 202 and 204, patterned features 208 and 210, or patterned feature 214 are part of another portion of the design. For example, as described further herein, the positions of defects with respect to different portions of a design as well as the correlation between the different portions of the design and different process steps performed on the wafer are used to associate different defects with different process steps. Therefore, if different portions of the design overlap on the wafer (as when they are formed above or below each other), the positions of the defects with respect to the different portions of the design may not be determined with sufficient accuracy thereby preventing the defects from being associated with the different process steps correlated to the different portions of the design with sufficient accuracy.

In another embodiment, the first and second portions of the design are formed on the same layer of the wafer. For example, as shown in FIG. 2, patterned features 202 and 204 that may be part of a first portion of a design formed on the wafer in a first process step and patterned features 208 and 210 that may be part of a second portion of the design formed on the wafer in a second process step may be formed on the same layer of the wafer. In another example, as shown in FIG. 3, patterned features 302, 304, 306, and 308 that may be part of a first portion of a design formed on the wafer in a first process, patterned features 310, 312, 314, and 316 that may be part of a second portion of the design formed on the wafer in a second process, and patterned features 318, 320, 322, and 324 that may be part of a third portion of the design formed on the wafer in a third process may be formed on the same layer of the wafer.

In addition, as shown in FIG. 2, the patterned features in different portions of the design that are formed on the same layer may have positions in the z direction that are the same. However, the patterned features in different portions of the design that are formed on the same layer may or may not have the same height. In addition, the patterned features in different portions of the design that are formed on the same layer may have different positions along the z direction such that the lowermost surfaces and/or the uppermost surfaces of the patterned features in different, portions of the design may or may not be located in the same x,y plane along the z direction. Preferably, however, the uppermost surfaces of the patterned features in both (or all) of the different portions of the design are not positioned so far apart from each other in the z direction that they cannot be adequately detected in the output of the inspection system. In other words, different patterned features in different portions of the design may have different locations with respect to the focal plane of the inspection system as long as they are not so far away from the focal plane that they cannot be imaged (or detected) adequately. Therefore, the z-direction differences in positions of all patterned features that are being inspected (and possibly reviewed) is preferably smaller than the depth of focus of the inspection system (and possibly the defect review system).

In a further embodiment, the first and second portions of the design are formed on different layers of the wafer, and the output of the detector may or may not be responsive to depth of the defects below an upper surface of the wafer. For example, the different portions of the design do not need to be formed on the same layer of the wafer. However, the different portions of the design are preferably formed on the wafer in a manner such that they can be identified in output of the inspection system and optionally output of a defect review tool. For example, the different portions of the design may be located on different layers of a wafer while still being within the depth of focus of the inspection system as described above. In addition, one or more portions of the design may be located under one or more unpatterned or patterned materials formed on the wafer above that portion (those portions) of the design if those overlying materials do not interfere with the ability of the inspection system, and possibly a defect review system, to "see" the patterned features in that portion (those portions) of the design. For example, a portion of the design may be located under one or more materials that are transparent (substantially or at least partially transparent) to the inspection system, and possibly defect review system, such that those one or more overlying materials do not inhibit the detection of light (or other energy, e.g., electrons) from the portion of the design. In this manner, the portions of the design and the defects located therein do not necessarily have to be on the uppermost layer of the wafer as long as they are "visible" to the inspection system (and possibly the defect review system if defect review images are used for separating the defects into different portions of defects that are located in different portions of a design). In this manner, if images generated by a defect review system configured as a scanning electron microscope (SEM) are used for determining the positions of the defects with respect to the first and second portions of the design, then all of the defects are preferably "visible" to the SEM regardless of their positions with respect to the uppermost layer on the wafer. Examples of layers that are not the uppermost on a wafer and yet can still be visible to a SEM include middle end of line layers that can be SEM reviewed to observe defects caused by multiple steps.

In addition, as described further herein, whether or not the inspection system (and possibly defect review system) output is responsive to the depth of the patterned features formed on the wafer below an upper surface of the wafer (or simply different positions of the patterned features with respect to the z-dimension), that information is not used, by or in the embodiments described herein, to determine the different portions of the design in which the defects are located. In other words, the defects are not correlated to the different portions of the design based on their positions in the z-direction.

Figure 5:
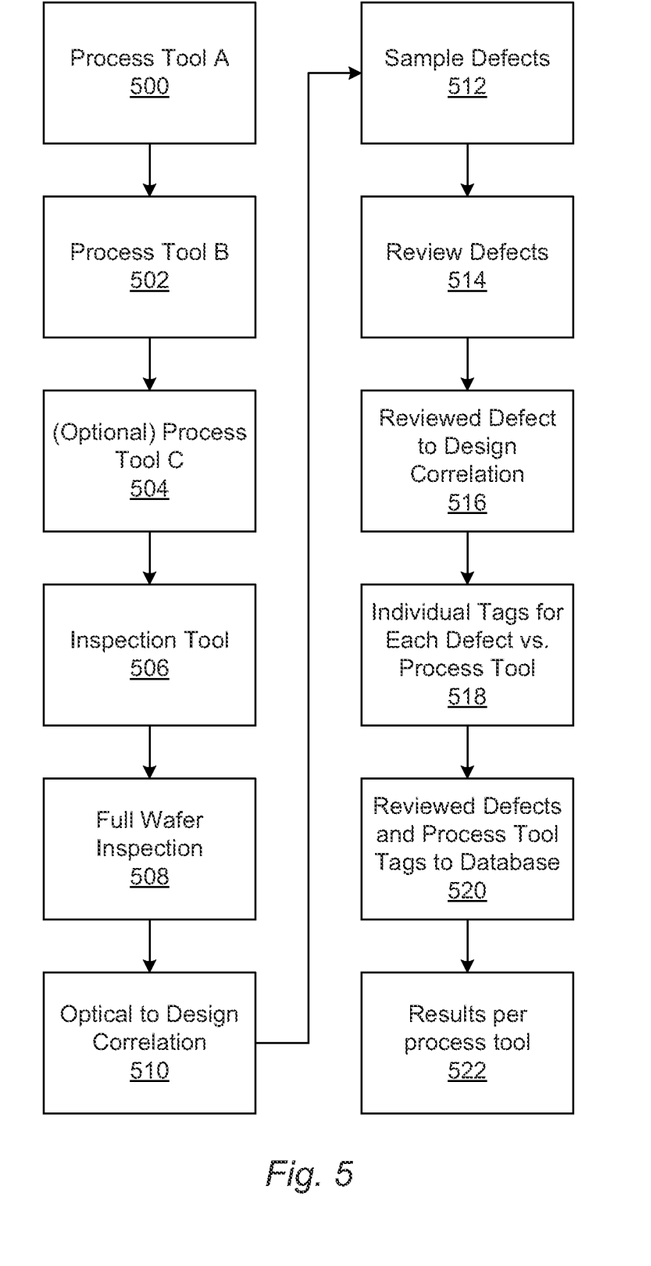

As also shown in FIG. 5, a wafer may be placed in process tool A, 500, which processes the wafer. The process step performed on the wafer by process tool A may be the first of a multi-step process. The wafer may then be placed in process tool B, 502, which processes the wafer. The process step performed on the wafer by process tool B may be the second of the same multi-step process. In this manner, the first process step and the second process step may be consecutive process steps that are performed one after the other to form at least a portion of the same device on the wafer. The wafer may then optionally be placed in process tool C, 504, or any other process tool that performs a consecutive process step on the wafer that is linked to the first two process step (i.e., is part of the same multi-step process as the first two process steps).

The first and second process steps may be part of any of a number of different multi-step processes. In one embodiment, the first process step includes a first patterning step of a multiple patterning step process, and the second process step includes a second patterning step of the multiple patterning step process. For example, a multiple patterning process may involve a sequence of lithography and etch steps (e.g., first lithography, first etch followed by second lithography, second etch, etc.) to form a pattern on a wafer. In this manner, the first process step may be a first etch step in a two-step double patterning method, and the second process step may be a second etch step in the two-step double patterning method. In addition, the process steps are not limited to two process steps and can be extended to any of multiple steps (e.g., double patterning, quad patterning, etc.). After the last of the process steps in the multi-step process, the wafer may be taken to inspection tool 506 (or other optical instrument) that is configured to identify process issues and output inspection results such as a wafer map with defect locations. Full wafer inspection 508 may then be executed by the inspection tool.

In another embodiment, the first portion of the design includes structures for N-type metal-oxide-semiconductor (NMOS) transistors, and the second portion of the design includes structures for P-type metal-oxide-semiconductor (PMOS) transistors. For example, the embodiments described herein may be used for NMOS and PMOS process steps where the inspection process described herein can be used for monitoring multiple process steps that are repeating etch and deposition steps. In some embodiments, the structures for the NMOS transistors and the PMOS transistors are wells. In this manner, the embodiments described herein can be used to monitor N-well and P-well definition. The structures for the NMOS and PMOS transistors may include other structures such as extension implants and metal patterning layers. The wells or any other structures for the NMOS and PMOS transistors may be formed in any suitable manner and have any suitable configuration known in the art.

In another embodiment, the first and second process steps are part of a back end of line (BEOL) metallization process. The metallization process may include any suitable metallization process known in the art that is used to form any metal layer(s) on the wafer (e.g., metal layer 1 (M1), metal layer 2 (M2), etc.).

The first and second process steps may also include any other process steps that are used in combination to form different (mutually exclusive portions of a design on a wafer, which are visible to an inspection system (and possibly a defect review system) in the same inspection process (and possibly in the same defect review process). For example, the first and second process steps may include process steps for hard mask deposition and patterning (for silicon germanium (SiGe) and silicon carbide (SiC) steps), aluminum salicide implants (on SiGe), etc.

The computer subsystem(s) are configured for detecting defects on the wafer based on the output. In this manner, the wafer may be inspected for defects. Detecting the defects on the wafer based on the output may be performed in any suitable manner known in the art. For example, the output may be used as input to one or more defect detection algorithms and/or methods. One example of such a defect detection algorithm may be configured for comparing the output to a threshold and any output having one or more values above the threshold may be identified as a potential defect white any output not having one or more values above the threshold may not be identified as a potential defect. However, the embodiments described herein are not limited to any particular defect detection method and/or algorithm, and a suitable defect detection method and/or algorithm may vary depending on a number of factors such as the inspection system configuration, the wafer type, and the types of defect(s) of interest (DOI(s)) that are to be detected on the wafer.

In some embodiments, detecting the defects may be performed based on the first and/or second portions of the design. For example, one or more parameters of the defect detection algorithm and/or method used for detecting the defects may be varied depending on the location on the wafer at which the output was generated and the portion of the design corresponding to the location. In this manner, detecting the defects may include design-driven semiconductor wafer defect inspection or metrology. Examples of methods and systems for design-driven inspection or metrology are described in U.S. Pat. No. 6,886,153 to Bevis issued on Apr. 26, 2005, which is incorporated by reference as if fully set forth herein. The embodiments described herein may be further configured as described in this patent.

The results of detecting defects on the wafer may be output in any suitable format. For example, the results of detecting defects on a wafer may be output in a file that includes the inspection results and that can be used by the computer subsystem(s) to perform other functions described herein. In addition, the results of the defect detection may be used to generate a number of different results such as wafer map 416 and pareto chart 418 shown in FIG. 4. Wafer map 416 may show locations of defects detected on the wafer after process B while pareto chart 418 may show the number of different types of defects or events detected on the wafer after process B. Therefore, in this instance, the defects whose positions are shown in the wafer map and whose types are shown in the pareto chart may include defects that are due to both process step A and process step B. Therefore, as described further herein, the computer subsystem(s) may be configured to perform a number of functions to separate the defects that have been detected into defects that are due to process step A and defects that are due to process step B.

The computer subsystem(s) are also configured for determining positions of the defects with respect to the first and second portions of the design. For example, as shown in FIG. 4, after both process step A and process step B have been performed on the wafer, the design A patterned features and design B patterned features will be formed on wafer 406. In addition, as shown in FIG. 4, defect 420 may be formed in or on one of patterned features 404 of design A while defect 422 may be formed in or on one of patterned features 412 of design B. Although one defect is shown located in or on one of each of patterned features 404 and 412, it is to be understood that any number of defects may be located in or on the patterned features included in the portions of the design corresponding to the different process steps. In addition, the shape, size, and location of defects 420 and 422 shown in FIG. 4 are not meant to indicate any actual characteristics of any actual defects that will be detected on any wafer. The embodiments described herein may, therefore, be configured for determining positions of the defects with respect to the features formed on the wafer and then use information about which features are included in which portion of the design to determine the portion of the design that the defect is positioned on or in. In the example shown in FIG. 4, the determining step may include determining that the position of defect 420 is located on or in one of features 404 and that features 404 are included in the portion of the design designated as design A. In addition, the determining step may include determining that the position of defect 422 is located on or in one of features 412 and that features 412 are included in the portion of the design designated as design B. Therefore, the determining step may include determining the position of defect 420 with respect to the portion of the design designated as design A and the position of defect 422 with respect to the portion of the design designated as design B.

In one embodiment, determining the positions of the defects as described above includes aligning the output for the defects generated by the detector to the first or second portion of the design. For example, as shown in FIG. 4, the computer subsystem(s) may be configured for defect to design alignment as shown in step 424. In another example, as shown in FIG. 5, the computer subsystem(s) may be configured to perform optical to design correlation 510. In this step, the computer subsystem(s) may overlay design files from both process steps with detected defect locations. Such overlay may be performed as described in U.S. Pat. No. 7,570,796 to Zafar et al. issued on Aug. 4, 2009, which is incorporated by reference as if fully set forth herein. The embodiments described herein may be configured to perform any step(s) described in this patent and may be further configured as described in this patent.

In this manner, the output of the detector may be aligned to different portions of the design to identify patterns in the different portions of the design that match (or substantially match) the patterns in the output information about the matching patterns in the different portions of the design may then be used to determine information about the defect such as design space coordinates for the defect, which portion of the design the defect is located within, position of the defect with respect to the portion of the design in which it is located, etc.

In a further embodiment, the first and second portions of the design are formed on different layers of the wafer, and when the output of the detector is responsive to depth of the defects below an upper surface of the wafer, determining the positions of the defects with respect to the first and second portions of the design is not performed based on the depth of the defects below the upper surface of the wafer. For example, as set forth in detail above, the output of the detector may be responsive to the depth of the defects below the upper surface of the wafer. However, in such instances, the depth of the defects below the wafer upper surface is not in of itself used to separate defects due to different process steps performed on the wafer. Instead, as described further herein, it is the portions of the design themselves that are preferably used to determine the positions of the defects with respect to the different portions of the design.

In another embodiment, the one or more computer subsystems are configured for sampling a portion of the detected defects and determining the positions of the defects includes aligning images of the sampled portion of the detected defects generated by the defect review subsystem to the first or second portion of the design. In this manner, after the wafer is inspected for defects, the defects may be sampled and reviewed. In one such embodiment, sampling the portion of the detected defects includes randomly selecting defects from different subpopulations of the defects determined based on spatial distribution of the defects across the wafer. For example, the computer subsystem(s) may be configured to sample defects, as shown in step 512 of FIG. 5, by sampling a reduced number of defects randomly to understand the defect distribution. The wafer may then be moved to a defect review subsystem such as a defect review subsystem of a defect review tool (e.g., an eDR defect review tool commercially available from KLA-Tencor or a similar SEM defect review tool) for imaging. The computer subsystem(s) may then be configured to review defects, as shown in step 514 of FIG. 5. The sampled defects may be reviewed and classified as described in U.S. Pat. No. 7,105,815 to Ohara et al. issued on Sep. 12, 2006, which is incorporated by reference as if fully set forth herein. The embodiments described herein may be configured to perform any step(s) described in this patent and may be further configured as described in this patent. As shown in FIG. 5, the computer subsystem(s) may be configured to perform reviewed defect to design correlation, as shown in step 516. Correlating defect review images to design can be executed on an analysis or yield management tool. The analysis includes correlating each sampled and reviewed defect with design, which may be performed as described further above with respect to optical to design correlation. In this manner, the design may be overlaid on review images for design to review correlation.

In another embodiment, the first process step is performed using information for only the first portion of the design, the second process step is performed using information for only the second portion of the design, and determining the positions of the defects is performed using the information for both the first and second portions of the design. For example, as shown in FIG. 4, the defect to design alignment may use correlation 426 of process A to design A to determine which defects are located within the portion of the design designated as design A and correlation 428 of process B to design B to determine which defects are located within the portion of the design designated as design B. Therefore, even though each process step may use information for only the portion of the design that it is forming on the wafer, the inspection step may use the information for all of the portions of the design that are formed in all of the process steps being considered by the inspection (and possibly review.

The computer subsystem(s) are further configured for associating different portions of the defects with the first or second process step based on the positions of the defects with respect to the first and second portions of the design. In this manner, the currently used methods and systems can be significantly improved upon by running two consecutive process steps (e.g., etch number 1 and etch number 2) and then running a single inspection step and correlating defectivity back to the first and second process steps. Correlating the defectivity back to the different process steps is enabled by correlating the defects to different portions of the design that correspond to the different process steps as described further herein. For example, once output of the optical subsystem and/or images generated by defect review have been aligned to the design information, the process step that formed the portion of the design that has been successfully aligned to the output and/or images can be determined based on the correspondence between the different portions of the design and the different process steps. The results produced by the embodiments described herein may, therefore, include multiple defect subpopulations generated from a single defect population and each of the subpopulations may be associated with only one of multiple process steps performed on the wafer.

The inspection system output (or review images) and design information may be used to assign indicia such as a tag to each defect or each reviewed image with the corresponding process step. For example, as shown in step 518 of FIG. 5, the computer subsystem(s) may be configured to generate individual tags for each defect vs. process tool. Tagging each defect with its respective process step (i.e., assigning a tag or another indicia to each defect, which indicates the process step that formed the portion of the design in which the defect is located) may be performed by one or more computer subsystem(s) of a defect review tool in embodiments in which the system includes and uses a defect review subsystem to generate images of the defects that are correlated to the different portions of the design. As further shown in step 520 of FIG. 5, the computer subsystem(s) may be configured to send the reviewed defects and process tool tags to a database such as a fab database or another suitable computer-readable storage medium described herein.

In this manner, the embodiments described herein build upon design-based inspections such as those described in the above-referenced patent to Bevis. In currently used methods, the inspection is driven by design. The embodiments described herein build on this technique and optionally add in information from design-based SEM review. The embodiments get the information from design and inspection and/or SEM review and break down analysis based on process tool correlation.

In one embodiment, the computer subsystem(s) are configured for determining one or more characteristics of one of the different portions of the defects associated with one of the first and second process steps. For example, for a first portion of the defects associated with the first process step, the computer subsystem(s) may use information for the defects in the first portion generated by the inspection system and/or defect review system to determine one or more characteristics of the first portion of the defects. Such characteristic(s) may include, for example, defect distribution across the wafer, classifications of the defects in the first portion, number of defects in the first portion per defect classification, number of defects in the first portion vs. patterned structure type, or any other suitable characteristics known in the art. Similar characteristics may be determined for other portions of the defects corresponding to other process steps. In other words, each portion of the defects corresponding to a different process step may be considered separately from each other portion as its own defect population, and any defect population characteristics known in the art may be determined in any suitable manner known in the art.

In another embodiment, the computer subsystem(s) are configured to generate first and second inspection results for the first and second process steps, respectively, based on the different portions of the defects associated with the first and second process steps, respectively. For example, once the different portions of the defects have been associated with the different process steps and the defects have (optionally) been classified, information for the different portions of defects such as pareto charts identifying the normalized defect distribution for each process step can be generated. In one such example, results of tagging each defect with its respective process step may be used to generate a separate pareto for each process step or each process tool. In another such example, for a double patterning process, the computer subsystem(s) may generate two paretos, one for the first lithography-etch sequence and another for the second lithography-etch sequence. In this manner, as shown in step 522 of FIG. 5, the computer subsystem(s) may be configured to generate results per process toot. For example, as shown in FIG. 4, the computer subsystem(s) may be configured to generate wafer map 430 for process A and pareto chart 432 for process A and to generate wafer map 434 for process B and pareto chart 436 for process B. Therefore, different and separate inspection results may be generated for each process step. The different and separate inspection results may be included in different inspection results files or in the same inspection results file.

In an additional embodiment, the one or more computer subsystems are configured for separately monitoring the first and second process steps based on the different portions of the defects associated with the first and second process steps, respectively. In other words, one portion of the defects associated with the first process step can be used to monitor the first process step, another portion of the defects associated with the second process step can be used to monitor the second process step, and so on. The systems described herein may, therefore, be configured for monitoring multiple process steps using a single inspection step. In addition, the defect images may be analyzed and classified as described in U.S. Pat. No. 5,761,064 to La et al. issued on Jun. 2, 1998, which is incorporated by reference as if fully set forth herein, for defect management and tracking. The embodiments described herein may be configured to perform any step(s) described in this patent and may be further configured as described in this patent. The process monitoring may also include any other suitable process monitoring known in the art. In addition, as described further herein, based on process tags, unique defect distribution and normalized defect charts can be generated for the different process steps, which can aid in understanding defectivity at each process tool.

The embodiments described herein, therefore, provide a number of advantages over other systems and methods. For instance, previous systems and methods for defect management and combining inspection and design data are capable of monitoring single process steps with a single inspection step. In contrast, the embodiments described herein correlate output of a single inspection/review process back to multiple process steps to provide a system for monitoring multiple process steps using a single inspection process. Therefore, the embodiments described herein enable reduction of inspection steps for consecutive fabrication process steps. As such, the embodiments described herein can reduce the amount of time needed for inspection processes. In particular, as described further herein, the embodiments use inspection performed only after the final step of consecutive fabrication process steps. The single inspection step may be used in conjunction with defect review and design information to extract information for multiple process steps (including those performed prior to the last process step before inspection) and monitor multiple process steps using a single step.

In addition, some currently used methods and systems use design, defect review, and inspection results to monitor one process tool and a single process step. In contrast, the embodiments described herein use design and inspection information (and optionally defect review information) and a correlation to each process step for monitoring multiple process steps. In this manner, unlike currently used methods and systems in which all defects detected by one inspection process are correlated to a single process step, the embodiments described herein correlate all defects detected by one inspection process to multiple process steps. Furthermore, currently used systems and methods require multiple inspection or metrology steps to understand defectivity across multiple, consecutive process steps. In contrast, the embodiments described herein include only one inspection or metrology process performed after the last of the multiple process steps for monitoring defectivity across multiple, consecutive process steps. Moreover, by implementing this methodology, more information can be provided on the status of multiple process tools.

The embodiments described herein can also be used to provide inspection capabilities for currently non-inspected steps such as intermediate steps of double or quad patterning or other processes in which an inspection is not performed after an intermediate step to save time or money. For example, with the embodiments described herein, users can understand the issues in intermediate steps of a quad patterning process using a single inspection step. The time on each process tool costs thousands of dollars and missing a process excursion can cost up to hundreds of thousands of dollars if the tool is down for a single day while determining the root cause of the process excursion. The embodiments described herein can, however, provide detailed defectivity reports for multiple process steps and mitigate the risk of the process tool going down thereby preventing extreme costs. In a similar manner, the embodiments described herein can be used for intermediate process step inspection when there is no time for inspection before another process step has to be performed on the wafer (e.g., when the wafer has to be moved to the next process tool before a material on the wafer starts degrading).

Each of the embodiments of the system may be further configured as described herein. In addition, each of the embodiments of the system described above may be combined together into one single embodiment. In other words, unless otherwise noted herein, none of the system embodiments are mutually exclusive of any other system embodiments. Furthermore, although FIGS. 4-5 show a variety of functions that may be performed by the computer subsystem(s) described herein, unless otherwise noted herein, none of the functions shown in these figures are essential to the function of the system embodiments described herein and/or practice of the method embodiments described herein. In other words, unless otherwise noted herein, the embodiments described herein may be configured to perform fewer than all of the functions shown in these figures or more than all of the functions shown in these figures, and the embodiments can still function and/or be practiced within the scope of these embodiments.

Another embodiment relates to a computer-implemented method for detecting defects on a wafer. The method includes acquiring output generated by an inspection system during an inspection process performed on the wafer. The output may include any of the output described herein. The inspection system may be configured according to any of the embodiments described herein.

The inspection process is performed after at least first and second process steps have been performed on the wafer. Inspection of the wafer is not performed between the first and second process steps. The first process step includes forming a first portion of a design for the wafer on the wafer, and the second process step includes forming a second portion of the design for the wafer on the wafer. The first and second portions of the design are mutually exclusive in space on the wafer. The first and second portions of the design may be further configured as described herein.

Acquiring the output generated by the inspection system may include actually performing an inspection process on the wafer (e.g., by generating output for the wafer using the inspection system). However, acquiring the output may not include performing an inspection process on the wafer. For example, acquiring the output may include acquiring the output from a storage medium in which the output has been stored by the inspection system. Therefore, although the embodiments described herein may include an optical subsystem and/or a defect review subsystem, the embodiments described herein may alternatively be performed without using an optical subsystem and/or a defect review subsystem. For example, the embodiments may be performed using only the one or more computer subsystem(s) described herein.

The method also includes detecting defects on the wafer based on the output. In addition, the method includes determining positions of the defects with respect to the first and second portions of the design. The method further includes associating different portions of the defects with the first or second process step based on the positions of the defects with respect to the first and second portions of the design. Each of these steps may be further performed according to embodiments described herein. The acquiring, detecting, determining, and associating steps are performed by one or more computer subsystems, which may be configured according to any of the embodiments described herein.

Each of the embodiments of the method described above may include any other step(s) of any other method(s) described herein. Furthermore, each of the embodiments of the method described above may be performed by any of the systems described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 6:
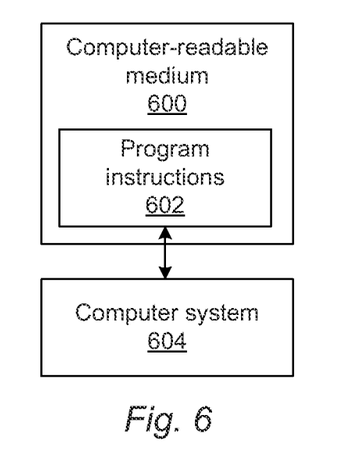
FIG. 6 is a block diagram illustrating one embodiment of a non-transitory computer-readable medium that includes program instructions executable on a computer system for performing one or more of the computer-implemented methods described herein.

An additional embodiment relates to a non-transitory computer-readable medium containing program instructions stored therein for causing a computer system to perform a computer-implemented method for detecting defects on a wafer. One such embodiment is shown in FIG. 6. In particular, as shown in FIG. 6, computer-readable medium 600 includes program instructions 602 executable on computer system 604. The computer-implemented method includes the steps of the method described above. The computer-implemented method for which the program instructions are executable may include any other step(s) described herein.

Program instructions 602 implementing methods such as those described herein may be stored on computer-readable medium 600. The computer-readable medium may be a storage medium such as a magnetic or optical disk, or a magnetic tape or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system may be further configured according to any of the embodiments described herein.

Further modifications and alternative embodiments of various aspects of the invention will be apparent to those skilled in the art in view of this description. For example, methods and systems for detecting defects on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to detect defects on a wafer, comprising:
   an optical subsystem comprising at least a light source and a detector, wherein the optical subsystem is configured to direct light generated by the light source to the wafer and to detect light from the wafer with the detector during an inspection process performed on the wafer to thereby generate output responsive to the light from the wafer, wherein the inspection process is performed after at least first and second process steps have been performed on the wafer, wherein inspection of the wafer is not performed between the first and second process steps, wherein first patterned features in a first portion of a design for the wafer are formed on the wafer in the first process step, wherein second patterned features in a second portion of the design for the wafer are formed on the wafer in the second process step, wherein the first and second portions of the design are mutually exclusive in space on the wafer, and Wherein the first and second patterned features have non-overlapping positions in the x and y directions; and
   one or more computer subsystems configured for:
      receiving the output generated by the detector responsive to the light detected by the detector;
      detecting defects on the wafer based on the output;
      determining positions of the defects with respect to the first and second patterned features in the first and second portions of the design based on the non-overlapping positions of the first and second patterned features in the x and y directions;
      determining the portion of the design that the defects are positioned on or in using information about which of the first and second patterned features are included in which of the first and second portions of the design thereby correlating the defects to the first and second portions of the design that correspond to the first and second process steps; and
      associating different portions of the defects with the first or second process step based on the positions of the defects with respect to the first and second patterned features in the first and second portions of the design by correlating the defects to the first and second process steps based on results of said correlating the defects to the first and second portions of the design, wherein the one or more computer subsystems comprise one or more processors executing instructions from a memory medium.

2. The system of claim 1, wherein determining the positions of the defects comprises aligning the output for the defects generated by the detector to the first or second portion of the design.

3. The system of claim 1, wherein the one or more computer subsystems are further configured for sampling a portion of the detected defects, wherein the system further comprises a defect review subsystem configured to generate images of the sampled portion of the detected defects, and wherein determining the positions of the defects comprises aligning images of the sampled portion of the detected defects to the first or second portion of the design.

4. The system of claim 3, wherein sampling the portion of the detected defects comprises randomly selecting defects from different subpopulations of the defects determined based on spatial distribution of the defects across the wafer.

5. The system of claim 3, wherein the defect review subsystem comprises an electron beam-based defect review subsystem.

6. The system of claim 1, wherein the one or more computer subsystems are further configured for determining one or more characteristics of one of the different portions of the defects associated with one of the first and second process steps.

7. The system of claim 1, wherein the one or more computer subsystems are further configured to generate first and second inspection results for the first and second process steps, respectively, based on the different portions of the defects associated with the first and second process steps, respectively.

8. The system of claim 1, wherein the one or more computer subsystems are further configured for separately monitoring the first and second process steps based on the different portions of the defects associated with the first and second process steps, respectively.

9. The system of claim 1, wherein the first process step is performed using information for only the first portion of the design, wherein the second process step is performed using information for only the second portion of the design, and Wherein determining the positions of the defects is performed using the information for both the first and second portions of the design.

10. The system of claim 1, wherein the space in which the first and second portions of the design are mutually exclusive is in a plane substantially parallel to an upper surface of the wafer.

11. The system of claim 1, wherein the first patterned features included in the first portion of the design are mutually exclusive of the second patterned features included in the second portion of the design.

12. The system of claim 1, wherein the first portion of the design is not formed above or below the second portion of the design.

13. The system of claim 1, wherein the first and second portions of the design are formed on the same layer of the wafer.

14. The system of claim 1, wherein the first and second portions of the design are formed on different layers of the wafer, and Wherein when the output of the detector is responsive to depth of the defects below an upper surface of the wafer, determining the positions of the defects with respect to the first and second patterned features in the first and second portions of the design is not performed based on the depth of the defects below the upper surface of the wafer.

15. The system of claim 1, wherein the first process step further comprises a first patterning step of a multiple patterning step process, and wherein the second process step further comprises a second patterning step of the multiple patterning step process.

16. The system of claim 1, wherein the first portion of the design comprises structures for N-type metal-oxide-semiconductor transistors, and wherein the second portion of the design comprises structures for P-type metal-oxide-semiconductor transistors.

17. The system of claim 16, wherein the structures for the N-type metal-oxide-semiconductor transistors and the P-type metal-oxide-semiconductor transistors are wells.

18. The system of claim 1, wherein the first and second process steps are part of a back end of line metallization process.

19. A non-transitory computer-readable medium containing program instructions stored therein for causing a computer system to perform a computer-implemented method for detecting defects on a wafer, wherein the computer-implemented method comprises:

generating output with an inspection system for a wafer during an inspection process performed on the wafer, wherein generating the output comprises directing light from a light source of the inspection system to the wafer and detecting light from the wafer with a detector of the inspection system to thereby generate the output responsive to the light from the wafer, wherein the inspection process is performed after at least first and second process steps have been performed on the wafer, wherein inspection of the wafer is not performed between the first and second process steps, wherein first patterned features in a first portion of a design for the wafer are formed on the wafer in the first process step, wherein second patterned features in a second portion of the design for the wafer are formed on the wafer in the second process step, wherein the first and second portions of the design are mutually exclusive in space on the wafer, and Wherein the first and second patterned features have non-overlapping positions in the x and y directions;

detecting defects on the wafer based on the output;

determining positions of the defects with respect to the first and second patterned features in the first and second portions of the design based on the non-overlapping positions of the first and second patterned features in the x and y directions;

determining the portion of the design that the defects are positioned on or in using information about which of the first and second patterned features are included in which of the first and second portions of the design thereby correlating the defects to the first and second portions of the design that correspond to the first and second process steps; and associating different portions of the defects with the first or second process step based on the positions of the defects with respect to the first and second patterned features in the first and second portions of the design by correlating the defects to the first and second process steps based on results of said correlating the defects to the first and second portions of the design, wherein said detecting, said determining the positions, said determining the portion, and said associating are performed by the computer system, and wherein the computer system comprises one or more processors executing the program instructions from the non-transitory computer-readable medium.

20. A computer-implemented method for detecting defects on a wafer, comprising:

generating output with an inspection system for a wafer during an inspection process performed on the wafer, wherein generating the output comprises directing light from a light source of the inspection system to the wafer and detecting light from the wafer with a detector of the inspection system to thereby generate the output responsive to the light from the wafer, wherein the inspection process is performed after at least first and second process steps have been performed on the wafer, wherein inspection of the wafer is not performed between the first and second process steps, wherein first patterned features in a first portion of a design for the wafer are formed on the wafer in the first process step, wherein second patterned features in a second portion of the design for the wafer are formed on the wafer in the second process step, wherein the first and second portions of the design are mutually exclusive in space on the wafer, and wherein the first and second patterned features have non-overlapping positions in the x and y directions;

detecting defects on the wafer based on the output;

determining positions of the defects with respect to the first and second patterned features in the first and second portions of the design based on the non-overlapping positions of the first and second patterned features in the x and y directions;

determining the portion of the design that the defects are positioned on or in using information about which of the first and second patterned features are included in which of the first and second portions of the design thereby correlating the defects to the first and second portions of the design that correspond to the first and second process steps; and associating different portions of the defects with the first or second process step based on the positions of the defects with respect to the first and second patterned features in the first and second portions of the design by correlating the defects to the first and second process steps based on results of said correlating the defects to the first and second portions of the design, wherein said detecting, said determining the positions, said determining the portion, and said associating are performed by one or more computer subsystems, and wherein the one or more computer subsystems comprise one or more processors executing instructions from a memory medium.

* * * * *